(12) United States Patent
Takahashi

(10) Patent No.: US 12,464,898 B2
(45) Date of Patent: Nov. 4, 2025

(54) DISPLAY DEVICE INCLUDING AN ELECTRODE COVERING AN INSULATOR, BARRIER WALLS, AND A SECOND ELECTRODE

(71) Applicant: Magnolia White Corporation, Tokyo (JP)

(72) Inventor: Hideyuki Takahashi, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 368 days.

(21) Appl. No.: 17/583,664

(22) Filed: Jan. 25, 2022

(65) Prior Publication Data
US 2022/0238840 A1 Jul. 28, 2022

(30) Foreign Application Priority Data

Jan. 27, 2021 (JP) ................. 2021-011145

(51) Int. Cl.
*H10K 59/122* (2023.01)
*H10K 50/816* (2023.01)
*H10K 50/844* (2023.01)
*H10K 59/124* (2023.01)
*H10K 71/00* (2023.01)

(52) U.S. Cl.
CPC ......... *H10K 59/122* (2023.02); *H10K 50/816* (2023.02); *H10K 50/844* (2023.02); *H10K 59/124* (2023.02); *H10K 71/00* (2023.02)

(58) Field of Classification Search
CPC ............... H10K 50/844; H10K 50/816; H10K 59/124; H10K 59/122; H01L 51/56; H01L 27/3246; H01L 51/5253; H01L 27/3258; H01L 51/5215
See application file for complete search history.

(56) References Cited

U.S. PATENT DOCUMENTS

2004/0160170 A1* 8/2004 Sato ..................... H10K 59/131
                                                                    313/504
2007/0040171 A1* 2/2007 Kim ..................... H10K 10/466
                                                                    257/40

(Continued)

FOREIGN PATENT DOCUMENTS

| JP | 2000-195677 A | 7/2000 |
| JP | 2004-207217 A | 7/2004 |

(Continued)

*Primary Examiner* — William B Partridge
*Assistant Examiner* — David Paul Sedorook
(74) *Attorney, Agent, or Firm* — Maier & Maier, PLLC

(57) ABSTRACT

According to one embodiment, a display device includes a first insulating layer disposed on a base material, a first electrode disposed on the first insulating layer, a second insulating layer disposed on the first insulating layer and including an opening portion, a barrier wall disposed on the second insulating layer, an organic layer in contact with the first electrode through the opening portion and in contact with the second insulating layer between the opening portion and the barrier wall, a second electrode disposed on the organic layer, an insulator covering side surfaces of the barrier wall and edge portions of the organic layer and the second electrode, and a third electrode covering the second electrode, the barrier wall, and the insulator.

8 Claims, 13 Drawing Sheets

(56) References Cited

U.S. PATENT DOCUMENTS

| | | | | |
|---|---|---|---|---|
| 2009/0009069 | A1* | 1/2009 | Takata | H10K 59/122 |
| | | | | 445/24 |
| 2015/0155516 | A1* | 6/2015 | Yamashita | H10K 50/11 |
| | | | | 438/46 |
| 2016/0188071 | A1* | 6/2016 | Xu | G06F 3/04166 |
| | | | | 345/174 |
| 2020/0136079 | A1* | 4/2020 | Mishima | H10K 50/16 |
| 2020/0225828 | A1* | 7/2020 | Jeong | G09G 3/32 |
| 2022/0199708 | A1* | 6/2022 | Lee | H10K 59/122 |

FOREIGN PATENT DOCUMENTS

| | | |
|---|---|---|
| JP | 2008-135325 A | 6/2008 |
| JP | 2009-32673 A | 2/2009 |
| JP | 2010-118191 A | 5/2010 |

\* cited by examiner

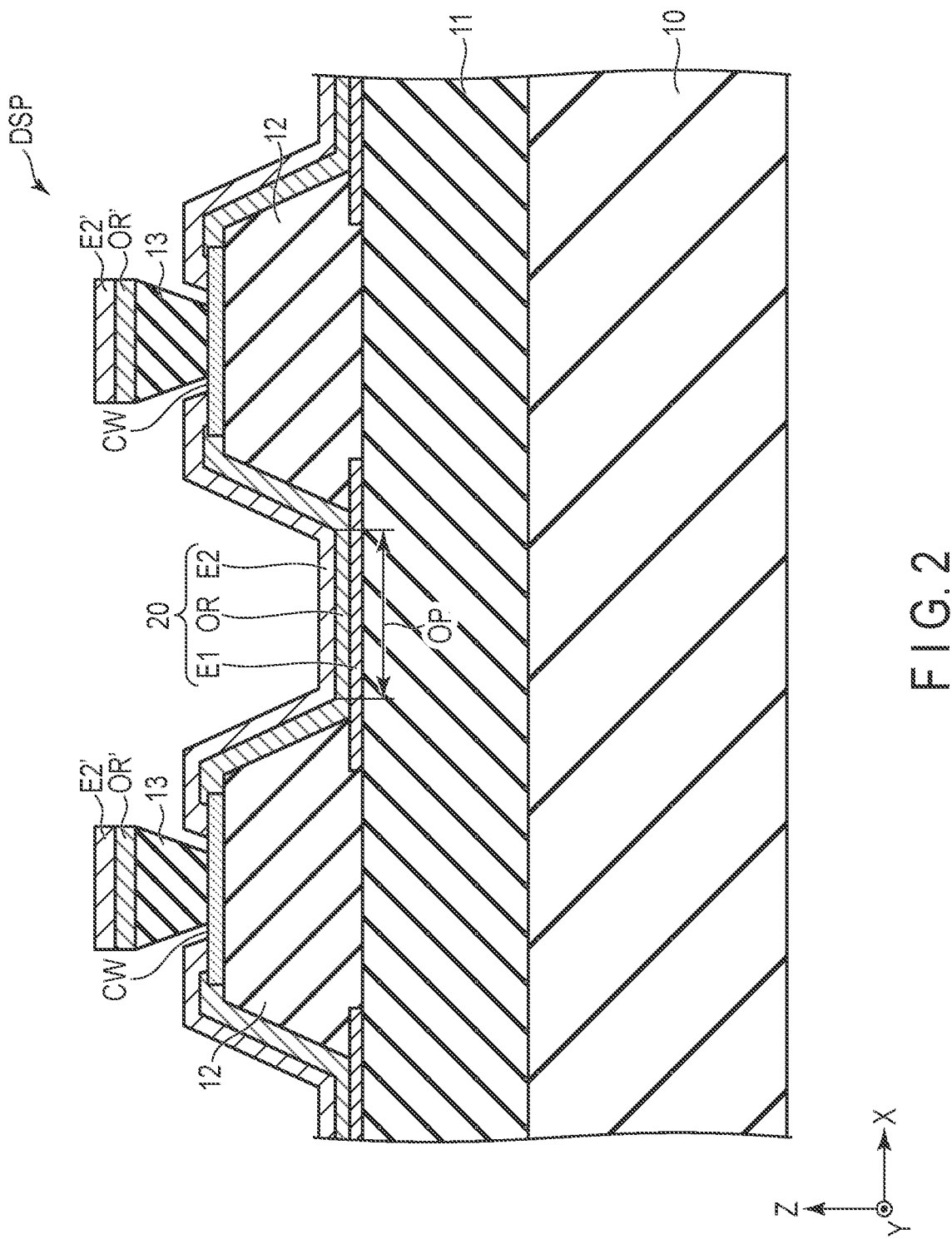
F I G. 2

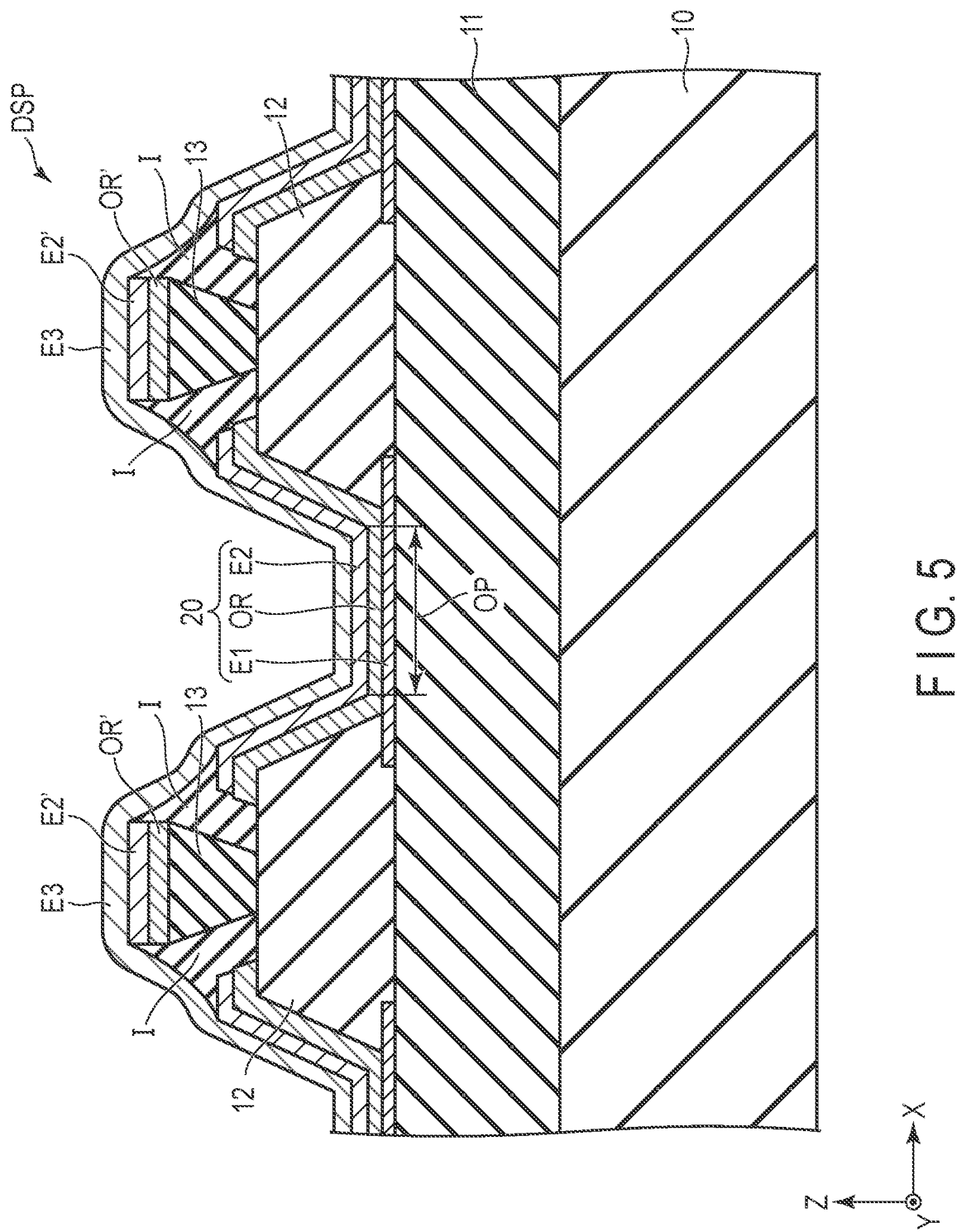
F I G. 5

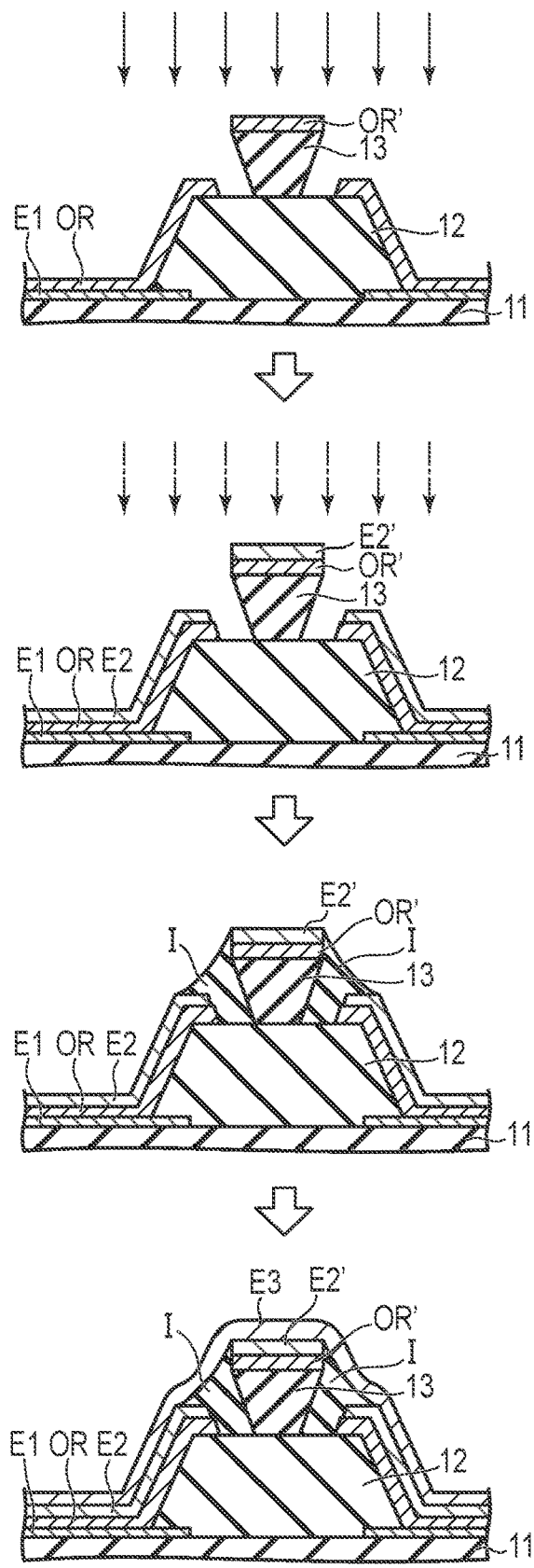
F I G. 7

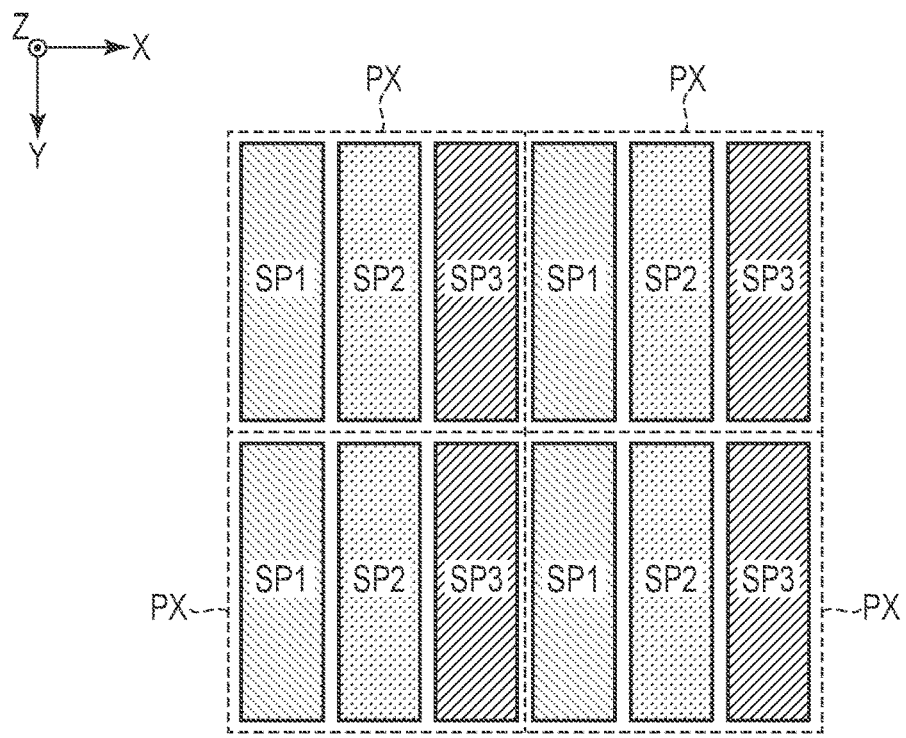
F I G. 14
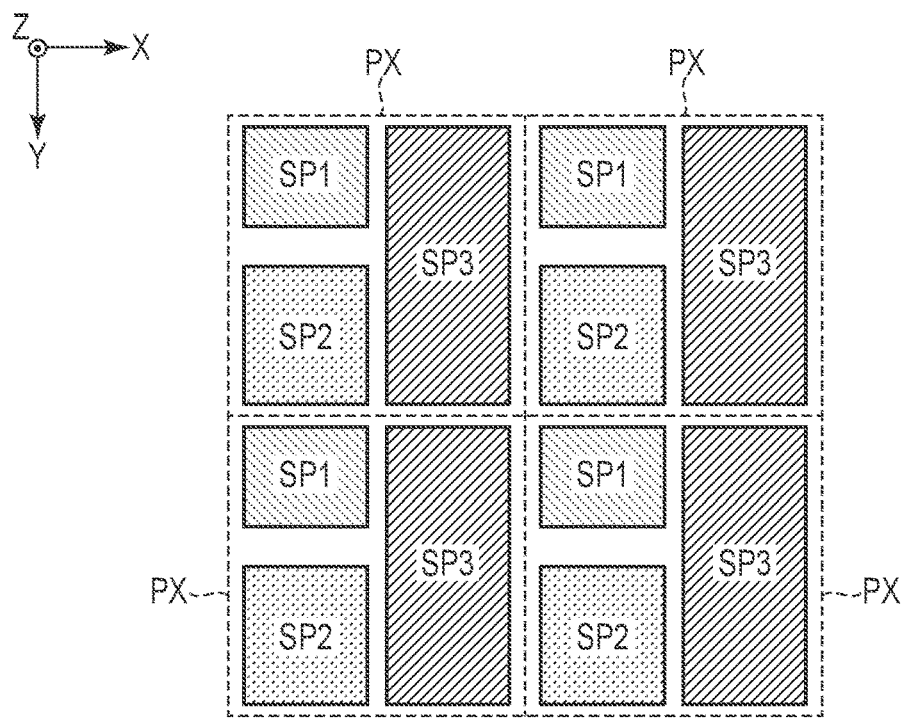
F I G. 15

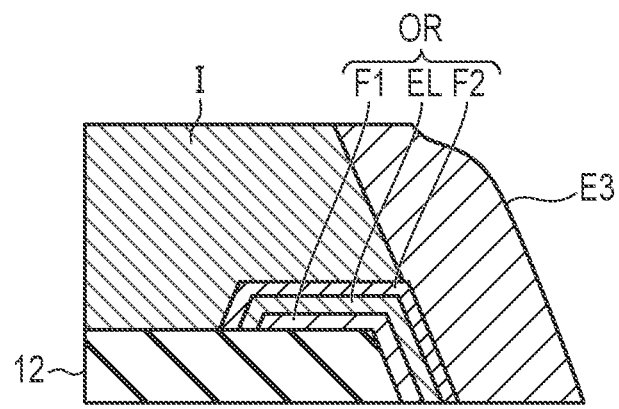
F I G. 18
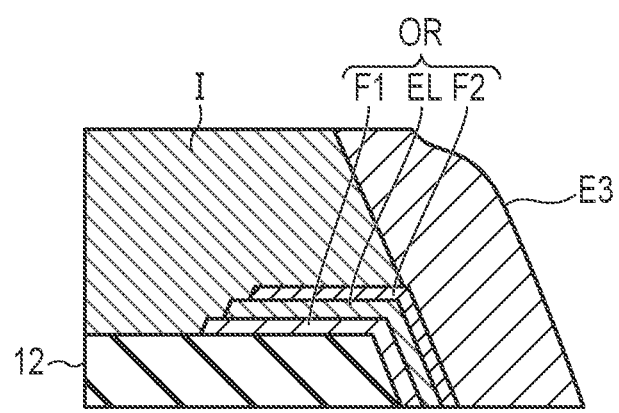
F I G. 19

DISPLAY DEVICE INCLUDING AN ELECTRODE COVERING AN INSULATOR, BARRIER WALLS, AND A SECOND ELECTRODE

CROSS-REFERENCE TO RELATED APPLICATIONS

This application is based upon and claims the benefit of priority from Japanese Patent Application No. 2021-011145, filed Jan. 27, 2021, the entire contents of which are incorporated herein by reference.

FIELD

Embodiments described herein relate generally to a display device.

BACKGROUND

In recent years, a display device to which an organic light-emitting diode (OLED) is applied as a display element has been put into practical use. The display element includes an organic layer between a pixel electrode and a common electrode.

However, depending on the configuration of the display device, a leak current is generated from the end of the organic layer, which causes deterioration in the performance of the display device.

BRIEF DESCRIPTION OF THE DRAWINGS

FIG. 2 is a drawing for explaining a display device according to a comparative example of the present embodiment.

FIG. 5 shows an example of a cross section of a display area included in the display device according to the present embodiment.

FIG. 7 is a drawing for explaining a process by which the organic layer, the second electrode, an insulator, and a third electrode are formed in the display device according to the present embodiment.

FIG. 14 shows an example of the arrangement of sub-pixels provided in a pixel.

FIG. 15 shows another example of the arrangement of sub-pixels provided in a pixel.

FIG. 18 is a drawing for explaining an example of an edge portion of the organic layer.

FIG. 19 is a drawing for explaining another example of the edge portion of the organic layer.

DETAILED DESCRIPTION

Figure 1:
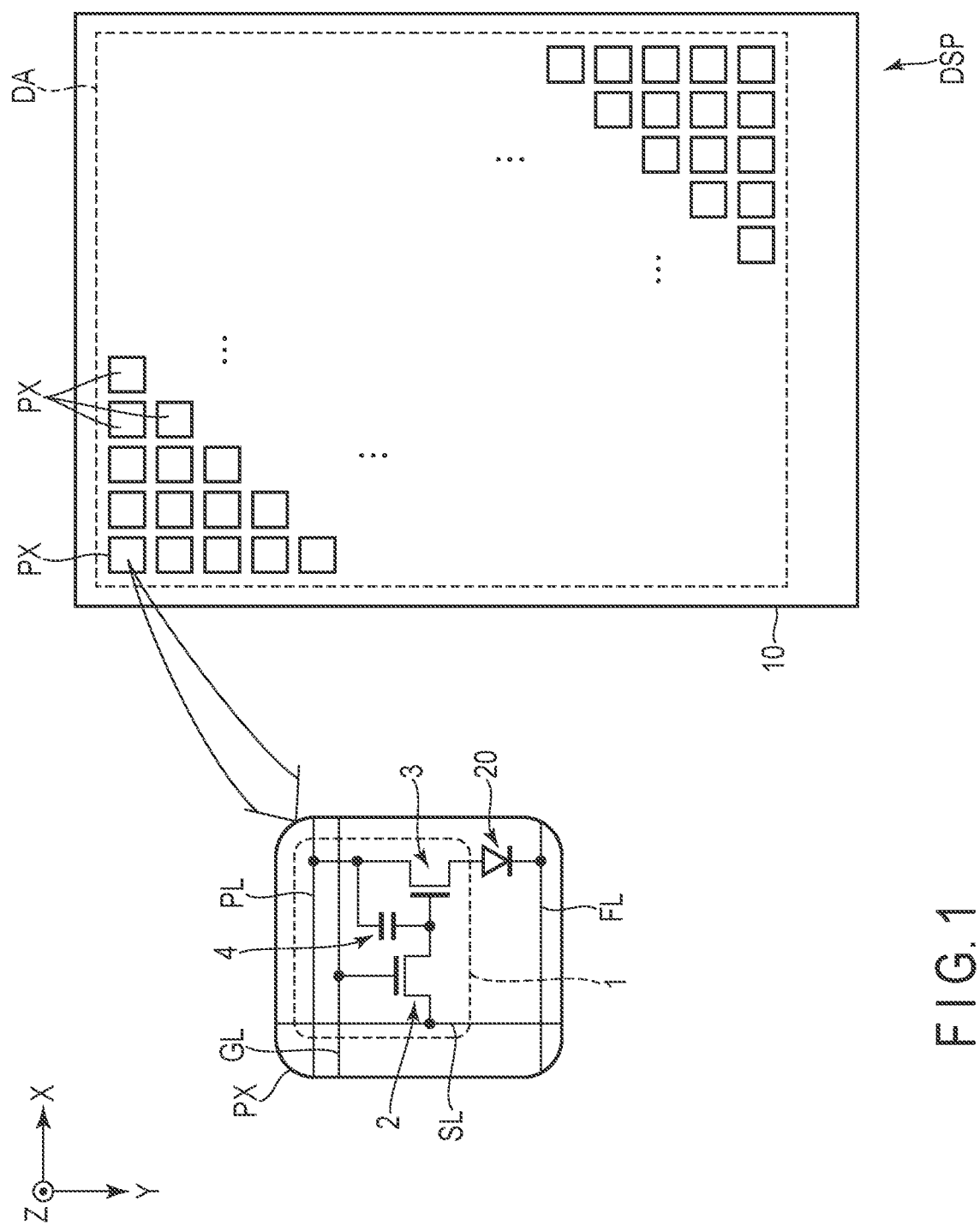
FIG. 1 shows an example of a configuration of a display device according to a first embodiment.

In general, according to one embodiment, a display device includes a base material, a first insulating layer disposed on the base material, a first electrode disposed on the first insulating layer, a second insulating layer disposed on the first insulating layer and including an opening portion overlapping with the first electrode, a barrier wall disposed on the second insulating layer, an organic layer in contact with the first electrode through the opening portion and in contact with the second insulating layer between the opening portion and the barrier wall, a second electrode disposed on the organic layer, an insulator covering side surfaces of the barrier wall and edge portions of the organic layer and the second electrode, and a third electrode covering the second electrode, the barrier wall, and the insulator.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. In this embodiment, viewing towards an X-Y plane defined by the X axis and the Y axis is referred to as planar view. Further, the third direction Z is referred to as "upward" and a direction opposite to the third direction is referred to as "downward". With such expressions "a second member above a first member" and "a second member below a first member", the second member may be in contact with the first member or may be remote from the first member.

A display device DSP according to the present embodiment is an organic electroluminescent display device including an organic light-emitting diode (OLED) as a display element, and is mounted on a television, a personal computer, a mobile terminal, and a cell phone, etc.

First Embodiment

First, a first embodiment will be explained. FIG. 1 shows an example of a configuration of a display device DSP in the present embodiment. The display device DSP includes a display area DA for displaying an image on an insulating base material 10. The base material 10 may be glass or a flexible resin film.

The display area DA includes a plurality of pixels PX arranged in a matrix in a first direction X and a second direction Y.

Here, a configuration example of a pixel PX will be briefly explained. The pixel PX includes a pixel circuit 1 and a display element 20. The pixel circuit 1 includes a pixel switch 2, a drive transistor 3, and a capacitor 4. The pixel switch 2 and the drive transistor 3 are switch elements configured by, for example, a thin film transistor (TFT).

In the pixel switch 2, a gate electrode is connected to a scanning line GL, a source electrode is connected to a signal line SL, and a drain electrode is connected to one of the electrodes configuring the capacitor 4 and a gate electrode of the drive transistor 3. In the drive transistor 3, a source electrode is connected to the other electrode configuring the capacitor 4 and a power line PL, and a drain electrode is connected to an anode electrode of the display element 20. A cathode electrode of the display element 20 is connected to an FL. The configuration of the pixel circuit 1 is not limited to the example shown in the drawing.

The display element 20 is an organic light-emitting diode (OLED), which is a light-emitting element. In the present embodiment, each of the plurality of pixels PX is assumed to include a display element 20 that emits, for example, light corresponding to the same wavelength. In this case, it is assumed that the display element 20 is configured to emit, for example, white light. The configuration of the display element 20 will be described later.

Here, with reference to FIG. 2, a display device DSP' according to a comparative example of the present embodiment will be described. It is assumed that the display device DSP' has the same configuration as the display device DSP shown in FIG. 1. Configurations common to the display device DSP are described with the same reference symbols as those in FIG. 1.

FIG. 2 shows an example of a cross section of a display area DA (pixel PX) included in the display device DSP'. Here, the configuration of a display element 20 included in the pixel PX is mainly described.

An insulating layer 11 is disposed on a base material 10. The pixel circuit 1 shown in FIG. 1 is disposed on the base material 10 and covered by the insulating layer 11; however, is omitted in FIG. 2. The insulating layer 11 corresponds to the base layer of the display element 20 and is, for example, an organic insulating layer.

An insulating layer 12 is disposed on the insulating layer 11. The insulating layer 12 is, for example, an organic insulating layer. The insulating layer 12 is formed so as to partition the display element 20 or the pixel PX including the display element 20, and may be referred to as a rib or the like, for example.

The display element 20 includes a first electrode E1, an organic layer OR, and a second electrode E2. The first electrode E1 is an electrode disposed for each display element 20 or pixel PX, and may be referred to as a pixel electrode, a bottom electrode, or an anode electrode, etc. The second electrode E2 is an electrode commonly disposed for a plurality of display elements 20 or a plurality of pixels PX, and may be referred to as a common electrode, a counter electrode, an upper electrode, or a cathode electrode, etc.

The first electrode E1 is disposed on the insulating layer 11, and its periphery is covered by the insulating layer 12. The first electrode E1 is electrically connected to the drive transistor 3 shown in FIG. 1. The first electrode E1 is a transparent electrode formed by a transparent conductive material such as indium tin oxide (ITO) or indium zinc oxide (IZO). The first electrode E1 may also be a metal electrode formed by a metallic material such as silver or aluminum. Also, the first electrode E1 may be a stacked layer body of a transparent electrode and a metal electrode. Furthermore, the first electrode E1 may be configured as a stacked layer body in which a transparent electrode, a metal electrode, and a transparent electrode are stacked in that order, or may be configured as a stacked layer body including three or more layers.

Here, the insulating layer 12 has an opening portion OP that overlaps with the first electrode E1 in each pixel PX. In this case, the organic layer OR is disposed on the insulating layer 12 and is in contact with the first electrode E1 through the opening portion OP.

The second electrode E2 is disposed on the organic layer OR so as to cover the organic layer OR. The second electrode E2 is a transparent electrode formed by a transparent conductive material such as ITO or IZO, for example. The second electrode E2 is electrically connected to a power supply line disposed on the display area DA or a power supply line disposed outside the display area DA. The second electrode E2 may be covered by a transparent protective film (including at least one of an inorganic insulating film and an organic insulating film).

Here, in the display device DSP', a barrier wall 13 is disposed at a position corresponding to a boundary between pixels PX. The barrier wall 13 has an inverted taper shape. An inverted taper shape indicates a shape in which the width of an upper part is larger than that of a lower part (bottom) as in the barrier wall 13 shown in FIG. 2. The side surfaces of the barrier wall 13 may be a flat or curved surface that inclines with respect to a third direction Z. The barrier wall 13 may be configured by a plurality of parts whose width gradually decreases from the upper part to the lower part.

Furthermore, the barrier wall 13 is formed in a manner overlapping with the insulating layer 12 in a plan view and partitioning the pixel PX. The organic layer OR described above is formed by, for example, an anisotropic or directional vacuum deposition method. In a case where an organic material for forming the organic layer OR is deposited, for example, on the entire display area DA in a state where the barrier wall 13 is disposed, the organic layer OR will hardly be formed on the side surfaces of the barrier wall 13 since the barrier wall 13 has an inverted taper shape. According to this, the organic layer OR that is in contact with the first electrode E1 through the above-mentioned opening portion OP and in contact with the insulating layer 12 between the opening portion OP and the barrier wall 13 is formed. In other words, the organic layer OR can be formed in such a way that each pixel PX is divided by the barrier wall 13.

Furthermore, the second electrode E2 is formed by a vacuum deposition method having a smaller directivity or an isotropic property than that at the time of vacuum deposition of the organic layer OR. In this case, the second electrode E2 can be formed in a manner covering the organic layer OR.

In other words, according to the configuration with the barrier wall 13 formed to partition the pixel PX, the organic layer OR and the second electrode E2 are partitioned and formed in the area surrounded by the barrier wall 13 (i.e., an area overlapping with the pixel PX) in a plan view.

In the case where the organic layer OR and the second electrode E2 are formed in the manner described above, an organic layer OR' and a second electrode E2', which are separated from the organic layer OR and the second electrode E2, are formed on the upper surface of the barrier wall 13.

The second electrode E2 is an electrode commonly disposed for the plurality of display elements 20 or the plurality of pixels PX described above, and although a common voltage is applied to the second electrode E2, the second electrode E2 is partitioned and formed for each pixel. For this reason, in the display device DSP', for example, the second electrode E2 formed in the area overlapping with the pixel PX and the second electrode E2 formed in the area overlapping with the pixel PX adjacent to such a pixel PX are to be connected via an auxiliary line (cathode line) CW. This auxiliary line CW is formed of a metal material and is disposed on the insulating layer 12. In addition, the above-mentioned barrier wall 13 is disposed on the auxiliary line CW.

Figure 3:
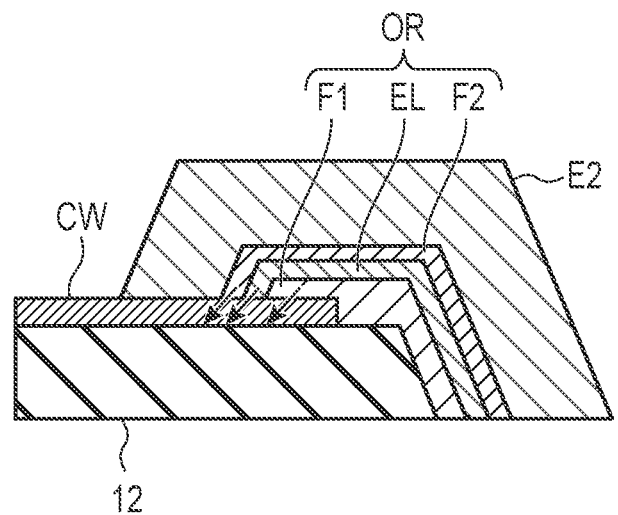
FIG. 3 is an enlarged view of an example of an edge portion of an organic layer and a second electrode.

Here, FIG. 3 shows the organic layer OR and the edge portion of the second electrode E2 shown in FIG. 2 in an enlarged view.

As shown in FIG. 3, the organic layer OR has a functional layer F1, a light-emitting layer EL, and a functional layer F2, which are stacked in order from the first electrode E1 toward the second electrode E2. In the case where the potential of the first electrode E1 is relatively higher than that of the second electrode E2, the first electrode E1 corresponds to the anode and the second electrode E2 corresponds to the cathode. In this case, the functional layer F1 between the light-emitting layer EL and the first electrode E1 includes at least one of a hole injection layer and a hole transport layer, and the functional layer F2 between the light-emitting layer EL and the second electrode E2 includes at least one of an electron transport layer and an electron injection layer. Each of the functional layers F1 and F2 is not limited to a single-layer body, but may also be a stacked layer body in which a plurality of functional layers are stacked.

Here, a case in which the first electrode E1 corresponds to the anode and the second electrode E2 corresponds to the cathode is described; however, a configuration in which the first electrode E1 corresponds to the cathode and the second electrode E2 corresponds to the anode is also applicable.

In addition, although the organic layer OR is described here as including the functional layers F1 and F2, the organic layer OR may be configured in a manner where at least one of the functional layers F1 and F2 is omitted.

In the case where the organic layer OR is provided with the functional layer F1, the light-emitting layer EL, and the functional layer F2 as described above, it is assumed that the edge portions of each of the functional layer F1, the light-emitting layer EL, and the functional layer F2 are in contact with the auxiliary line CW.

In this case, a driving current is supplied to the organic layer OR provided between the first electrode E1 and the second electrode E2 to cause the light-emitting layer contained in the organic layer OR to emit light. In such case, when the organic layer OR, the second electrode E2, and the auxiliary line CW are formed in the manner shown in FIG. 3, a current (leak current) that does not contribute to the light emission of the light-emitting layer EL is generated from the edge portion of the organic layer OR (functional layer F1, light-emitting layer EL, and functional layer F2) to the auxiliary line CW. This leak current causes a deterioration in the performance of the display device DSP'.

In the example shown in FIG. 3, the functional layer F1 is covered by the light-emitting layer EL, the light-emitting layer EL is covered by the functional layer F2, and the functional layer F2 is covered by the second electrode E2. However, depending on the directivity of the vacuum deposition method described above, as shown in FIG. 4, the organic layer OR may be formed in a manner such that the edge portions of each of the functional layer F1, the light-emitting layer EL, and the functional layer F2 are covered by the second electrode E2.

Figure 4:
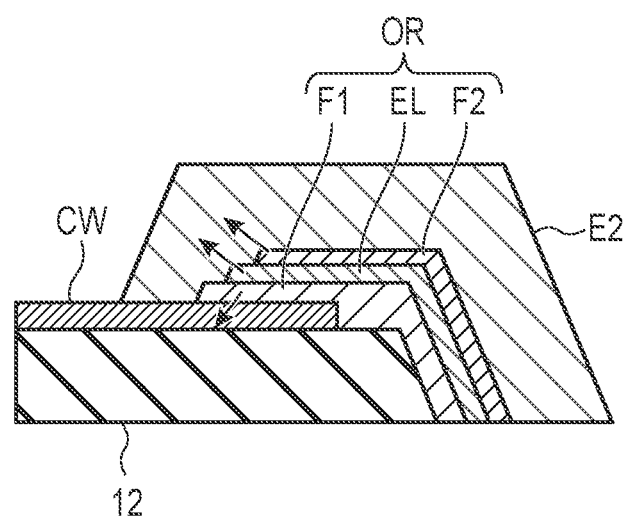
FIG. 4 is an enlarged view of another example of an edge portion of the organic layer and the second electrode.

Even in this example shown in FIG. 4, a leak current is generated from the edge portion of the organic layer OR (functional layer F1, light-emitting layer EL, and functional layer F2) to the second electrode E2 or the auxiliary line CW.

Therefore, the present embodiment has a configuration for suppressing the generation of the leak current described above.

In the following, an example of the configuration for suppressing the generation of the leak current in the display device DSP of the present embodiment will be described with reference to FIG. 5. FIG. 5 shows an example of a cross section of the display area DA (pixel PX) provided in the display device DSP. In FIG. 5, parts that are the same as those in FIG. 2 are given the same reference symbols as those in FIG. 2 above, and detailed descriptions thereof are omitted. Parts that are different from those in FIG. 2 are mainly described.

In the present embodiment, the second electrode E2 is disposed on the organic layer OR, and as shown in FIG. 5, an insulator (insulator) I is formed to cover the side surfaces of the barrier wall 13 and the edge portions of the organic layer OR and the second electrode E2. In other words, the present embodiment has a configuration in which the insulator I is filled in the space formed by the side surfaces of the barrier wall 13, the edge portions of the organic layer OR and the second electrode E2, and the insulating layer 12.

In the display device DSP' according to the comparative example of the present embodiment described above, it is assumed that the second electrode E2 formed in the area overlapping with each of the adjacent pixels PX is connected via the auxiliary line CW. However, such an auxiliary line is not formed in the display device DSP according to the present embodiment.

For this reason, in the present embodiment, a third electrode E3 for applying a common voltage to each of the second electrodes E2 partitioned for each pixel PX is formed in a manner covering the second electrode E2, the barrier wall 13 (the organic layer OR' and the second electrode E2' formed on the upper surface of the barrier wall 13), and the insulator I.

Although not shown in FIG. 5, the third electrode E3 is connected to, for example, a power supply line (auxiliary line) or the like disposed in an area outside the display area DA.

Figure 6:
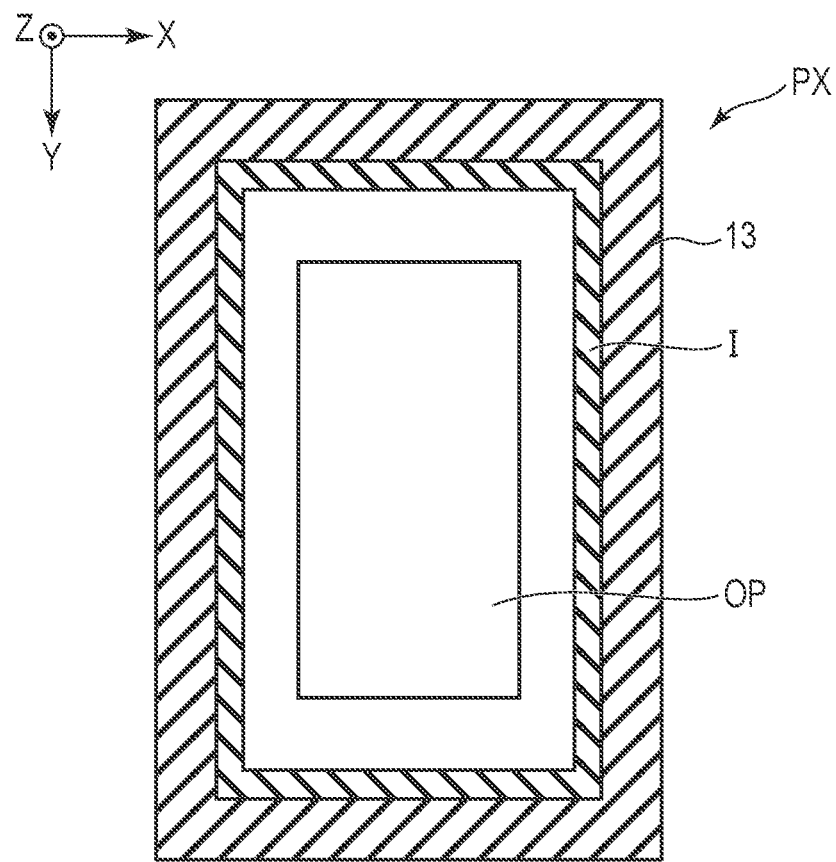
FIG. 6 is a schematic plan view of a pixel PX.

FIG. 6 is a schematic plan view of the pixel PX. Here, the positional relationship of the opening portion OP, the barrier wall 13, and the insulator I described above in a plan view will be mainly explained.

As shown in FIG. 6, the barrier wall 13 is formed in a manner partitioning the pixel PX, and in the area partitioned by the barrier wall 13 (i.e., the area overlapping with the pixel PX), the opening portion OP corresponding to a light-emitting part of the pixel PX is disposed.

Furthermore, in the pixel PX, on the inner side of the barrier wall 13 (the side surfaces of the opening portion OP side), the insulator I is formed to cover the side surfaces thereof.

That is, in the present embodiment, the organic layer OR and the second electrode E2, which are separated for each pixel PX using the barrier wall 13, are surrounded by the insulator I.

Although not shown in FIG. 6, the third electrode E3 shown in FIG. 5 is formed over the entire pixel PX.

Here, with reference to FIG. 7, a process by which the organic layer OR, the second electrode E2, the insulator I, and the third electrode E3 are formed in the display device DSP of the present embodiment will be briefly explained. Here, it is assumed that the first electrode E1, the insulating layer 12 having an opening portion OP, and the barrier wall 13 are already formed on the insulating layer 11.

First, the organic layer OR is formed (deposited) by the vacuum deposition method described above. In this case, the organic layer OR that is in contact with the first electrode E1 through the opening portion OP of the insulating layer 12 and is in contact with the insulating layer 12 between the opening portion OP and the barrier wall 13 is formed. In addition, the organic layer OR' is formed on the upper surface of the barrier wall 13.

In the case where the organic layer OR is formed in the manner described above, the second electrode E2 is formed (deposited) by the vacuum deposition method. In this case, the second electrode E2 is formed on the organic layer OR. In addition, the second electrode E2' is formed on the organic layer OR' on the upper surface of the barrier wall 13.

Although a detailed description will be omitted, in the case where the organic layer OR and the second electrode E2 are formed by the vacuum deposition method with the barrier wall 13 disposed on the insulating layer 12 in the manner described above, for example, by attaching the second electrode E2' to the organic layer OR' on the upper surface of the barrier wall 13, the second electrode E2 is formed in a manner such that the edge portion of the second electrode E2 is positioned farther from the barrier wall 13 than the edge portion of the organic layer OR.

In the case where the organic layer OR and the second electrode E2 are formed in the manner described above, the insulator I is formed to cover the side surfaces of the barrier wall 13 and the edge portions of the organic layer OR and the second electrode E2. This insulator I is formed by, for example, applying an insulating material such as resin over the display area DA (the plurality of pixels PX provided in the display area DA) and removing the insulating material so that only the portion in the space formed by the side surfaces of the barrier wall 13 (i.e., the inverted taper portion), the edge portions of the organic layer OR and the second electrode E2, and the insulating layer 12 remains. Note that the insulator I may be formed by patterning using, for example, a photomask.

In order to prevent air bubbles from entering the insulator I, the insulator I may be formed after the above-mentioned organic layer OR and second electrode E2 are formed by the vacuum deposition method, while maintaining the vacuum state.

In the case where the insulator I is formed in the manner described above, for example, the third electrode E3 is formed (deposited) over a plurality of pixels PX disposed in the display area DA. According to such a third electrode E3, a common voltage can be applied to each of the plurality of pixels PX via the second electrode E2 formed at a position overlapping with each of the pixels PX.

As described above, the display device DSP of the present embodiment includes the base material 10, the insulating layer 11 (first insulating layer) disposed on the base material 10, the first electrode E1 disposed on the insulating layer 11, the insulating layer 12 (second insulating layer) disposed on the insulating layer 11 and having an opening portion OP overlapping with the first electrode E1, and the barrier wall 13 disposed on the insulating layer 12. The display device DSP according to the present embodiment also includes the organic layer OR that is in contact with the first electrode through the opening portion OP and in contact with the insulating layer 12 between the opening portion OP and the barrier wall 13, the second electrode E2 disposed on the organic layer OR, the insulator I covering the side surface of the barrier wall 13 and the edge portions of the organic layer OR and the second electrode E2, and the third electrode E3 that covers the second electrode E2, the barrier wall 13, and the insulator I.

Here, in the comparative example of the present embodiment described above, the second electrodes E2 formed in the area overlapping with the adjacent pixels PX are connected to each other via the auxiliary line CW In such a configuration, a leak current may be generated from the edge portion of the organic layer OR.

On the other hand, in the present embodiment, the edge portion of the organic layer OR is covered by the insulator I without having to provide the auxiliary line CW. Therefore, it is possible to suppress the generation of a leak current from the edge portion of the organic layer OR.

In the present embodiment, the third electrode E3 is formed over the plurality of second electrodes E2 formed in the area overlapping with each of the plurality of pixels PX. That is, in the present embodiment, even if the auxiliary line CW in the above comparative example is not provided, the display device DSP (the second electrode E2 provided in the display device DSP) can be driven normally by the third electrode E3.

Figure 8:
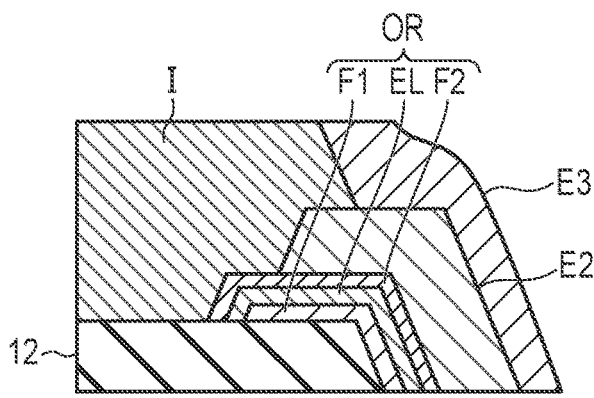
FIG. 8 is a drawing for explaining an example of the edge portion of the organic layer and the second electrode.
Figure 9:
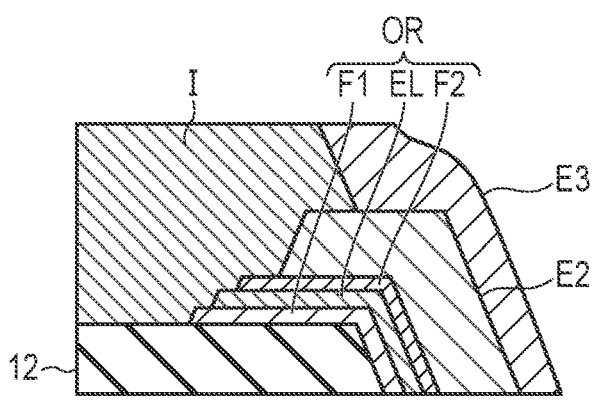
FIG. 9 is a drawing for explaining another example of the edge portion of the organic layer and the second electrode.

Here, FIG. 8 and FIG. 9 show enlarged views of the edge portions (periphery) of the organic layer OR and the second electrode E2 in the display device DSP according to the present embodiment.

In FIG. 8, an organic layer OR is shown in which (the edge portion of) the functional layer F1 is covered by the light-emitting layer EL and (the edge portion of) the light-emitting layer EL is covered by the functional layer F2. In the case where the edge portion of the organic layer OR is covered by the insulator I as shown in FIG. 8, no leak current is generated from the organic layer OR.

Furthermore, in FIG. 9, an organic layer OR in which the light-emitting layer EL is disposed on the functional layer F1 and the functional layer F2 is disposed on the light-emitting layer EL (i.e., an organic layer OR in which the edge portion of the functional layer F1 is not covered by the light-emitting layer EL, and the edge portion of the light-emitting layer EL is not covered by the functional layer F2) is shown. However, even in the case where the edge portions of the organic layer OR (functional layer F1, light-emitting layer EL, and functional layer F2) are covered by the insulator I as shown in FIG. 9, no leak current would not be generated from the organic layer OR as well.

In FIG. 8 above, the end surfaces of each of the functional layer F1, the light-emitting layer EL, and the functional layer F2 are in contact with the insulating layer 12; however, "the edge portion of the organic layer OR is covered by the insulator I" in the present embodiment includes a state in which the end surfaces of each of the functional layer F1, the light-emitting layer EL, and the functional layer F2 are in contact with the insulating layer 12 or the insulator I as shown in FIG. 8 and FIG. 9, and are not in contact with the second electrode E2.

That is, the edge portion of the organic layer OR in the present embodiment is to be a part that can be recognized as an edge portion when the organic layer OR is viewed as a whole.

Furthermore, depending on the directivity in the vacuum deposition method, the organic layer OR in the present embodiment may be covered by the second electrode E2.

Figure 10:
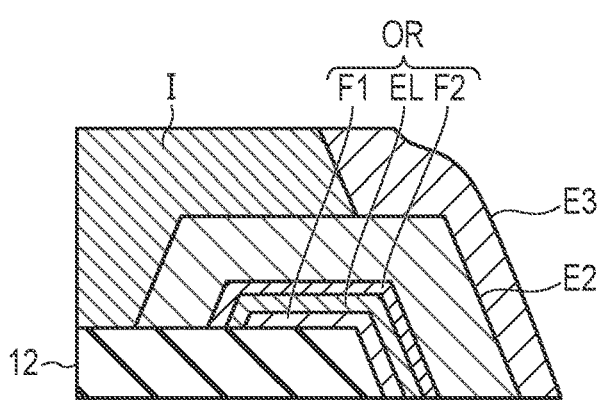
FIG. 10 is a drawing for explaining yet another example of the edge portion of the organic layer and the second electrode.
Figure 11:
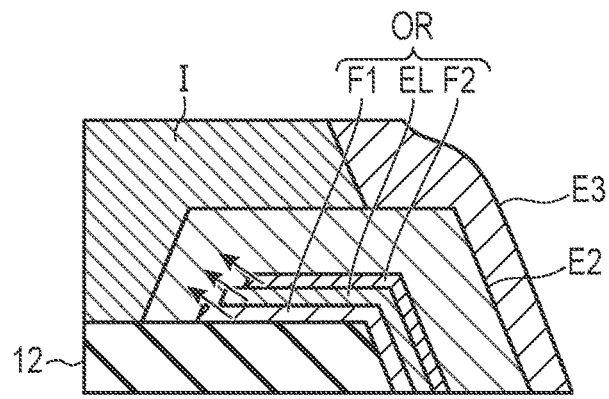
FIG. 11 shows an example of an edge portion of the organic layer and the second electrode where a leak current may be generated.

In this case, for example, as shown in FIG. 10, if each of the edge portions of the functional layer F1, the light-emitting layer EL, and the functional layer F2 configuring the organic layer OR is configured not to be in contact with the second electrode E2 (that is, in contact with the insulating layer 12), the generation of a leak current can be suppressed. However, as shown in FIG. 11, in the case where each of the edge portions (end surfaces) of the functional layer F1, the light-emitting layer EL, and the functional layer F2 configuring the organic layer OR is configured to be in contact with the second electrode E2, a leak current may be generated.

That is, in the present embodiment, it is preferable to form the organic layer OR and the second electrode E2 in the manner shown in FIG. 8 and FIG. 9 above, because the leak current generation may not be suppressed due to the structure of the organic layer OR in the case where the organic layer OR is covered by the second electrode E2. In other words, it is preferable that the organic layer OR and the second electrode E2 in the present embodiment are formed so that the edge portion of the organic layer OR is closer to the barrier wall 13 than the edge portion of the second electrode E2.

In addition, in the present embodiment, since the barrier wall 13 is disposed in a manner partitioning each of the pixels PX, the organic layer OR can be separated for each of the pixels PX. Therefore, for example, it is also possible to suppress the generation of a leak current (lateral leakage) between the organic layers OR provided in each of the adjacent pixels PX. Furthermore, in the present embodiment, since the organic layer OR is separated by the barrier wall 13, there is no need to use a fine mask or the like to separate the organic layer OR.

Figure 12:
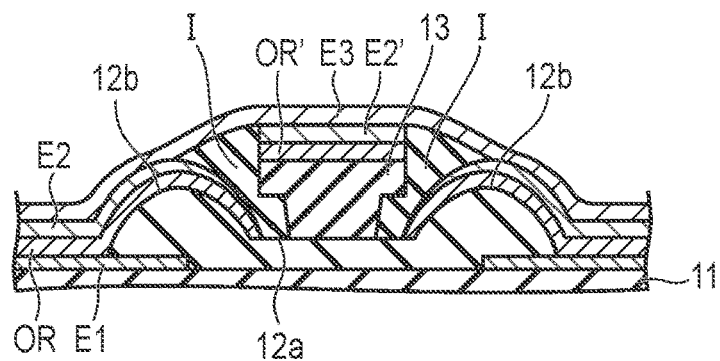
FIG. 12 shows another example of the configuration in the periphery of the insulator.

In the present embodiment, an example of the configuration of the display device DSP is described using FIG. 5; however, the periphery of the insulator I in the display device DSP may be configured in the manner shown in, for example, FIG. 12. In the display device DSP shown in FIG. 12, the insulating layer 12 includes, for example, a first surface 12a on which the lower part of the barrier wall 13 is disposed, and a second surface 12b that is located on the upper side of the barrier wall 13 than the first surface 12a. With this configuration, the insulator I can be formed more easily (i.e., it is easier to leave an insulating material such as resin in the space formed by the side surface of the barrier wall 13, the edge portions of the organic layer OR and the second electrode E2, and the insulating layer 12) compared to the configuration shown in FIG. 5 above.

In addition, in FIG. 5, the barrier wall 13 having an inverted taper shape is shown; however, in the example shown in FIG. 12, the barrier wall 13 configured by a plurality of parts whose width gradually decreases from the upper part to the lower part is shown.

Figure 13:
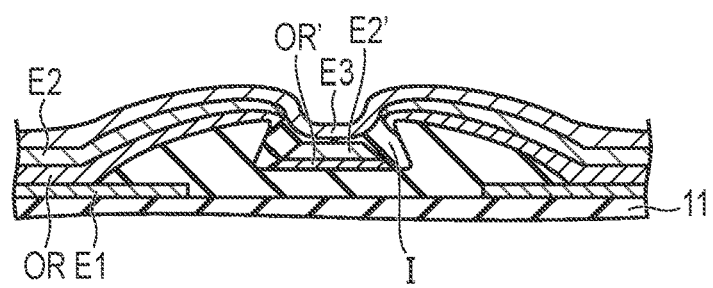
FIG. 13 shows yet another example of the configuration in the periphery of the insulator.

Furthermore, although the detailed description is omitted, FIG. 13 shows an example of a configuration in the periphery of the insulator I of the display device DSP in which the barrier wall 13 is not provided. That is, in the present embodiment, if the edge portions of the organic layer OR and the second electrode E2, which are partitioned for each pixel PX to suppress the generation of leak current, are covered by the insulator I, the partition 13 may be provided or not be provided in the configuration.

In the present embodiment, each of the plurality of pixels PX is described as being provided with the display element 20 that emits, for example, white light. In the case of such a configuration, for example, by providing a color filter colored red, green, and blue at a position facing the display element 20 (a position in the direction of a counter-substrate) in the display device DSP, red, green, and blue light can be emitted from each pixel PX, thus enabling multi-color display.

In addition, in the case where the display element 20 emits ultraviolet light (i.e., the emitting color is ultraviolet light), multi-color display can be realized by disposing a light conversion layer at a position facing the display element 20.

Furthermore, the present embodiment may be configured in a manner such that each of the plurality of pixels PX includes a plurality of sub-pixels that display different colors. In one example, the pixel PX includes a sub-pixel SP1 that displays red, a sub-pixel SP2 that displays green, and a sub-pixel SP3 that displays blue. The sub-pixels SP1, SP2, and SP3 may be configured to display red, green, and blue (i.e., emit red, green, and blue light) using the color filter or light conversion layer described above. Alternatively, the display element may be provided so that each of the organic layers of the sub-pixels SP1, SP2 and SP3 includes a light-emitting layer that emits red, green, and blue light.

In this case, (pixels PX including) the sub-pixels SP1, SP2, and SP3 can be arranged in the manner shown in, for example, FIG. 14 and FIG. 15. Although omitted in FIG. 14 and FIG. 15, the sub-pixels SP1, SP2, and SP3 arranged in the manner shown in FIG. 14 and FIG. 15 may be configured to be partitioned by the barrier wall 13 and the insulator I covering the side surfaces of the barrier wall 13 and the edge portions of the organic layer OR and the second electrode E2, as in the case described in FIG. 6 above.

The outline of the sub-pixels SP1, SP2, and SP3 shown in FIG. 14 and FIG. 15 corresponds to, for example, the outline of the light-emitting area of the display device 20 (the area of the opening portion OP where the first electrode E1, the organic layer OR, and the second electrode E2 overlap); however, FIG. 14 and FIG. 15 are merely simplified images to explain the arrangement (layout) of sub-pixels SP1, SP2, and SP3, and do not necessarily reflect the actual shape.

Here, the pixel PX is described as including the sub-pixels SP1, SP2, and SP3; however, the pixel PX may also include four or more sub-pixels.

Second Embodiment

Now, a second embodiment will be explained. In the following explanation, detailed explanations are omitted for parts identical to those in the first embodiment. Here, parts that differ from the first embodiment are mainly explained.

Figure 16:
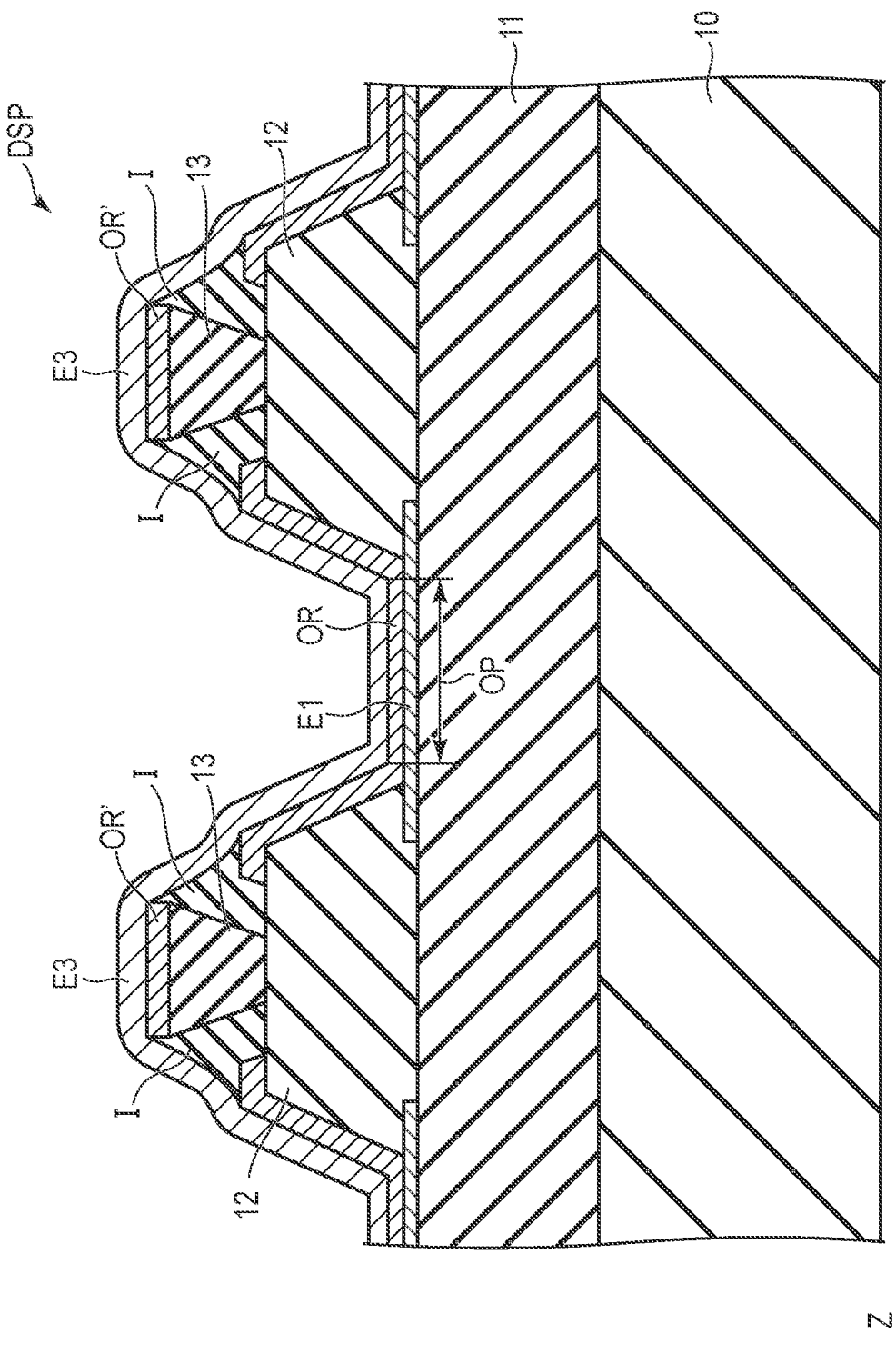
FIG. 16 shows an example of a cross section of a display area included in a display device according to a second embodiment.

FIG. 16 shows an example of a cross section of a display area (pixel) included in a display device according to the present embodiment. In FIG. 16, parts that are the same as those in FIG. 5 are given the same reference symbols as those in FIG. 5 above, and detailed descriptions thereof are omitted. Parts that are different from those in FIG. 5 are mainly described.

In the first embodiment described above, the second electrode E2 is disposed on the organic layer OR, and the third electrode E3 is formed to cover the second electrode E2, the barrier wall 13, and the insulator I as shown in FIG. 5. However, the present embodiment differs from the first embodiment described above in that the second electrode E2 is omitted, and the third electrode E3 is formed to cover the organic layer OR, the barrier wall 13 (organic layer OR' formed on the upper surface of the barrier wall 13), and the insulator I.

Since a display device DSP shown in FIG. 16 is the same as the display device DSP shown in FIG. 5 above except that the second electrode E2 is omitted as described above, a detailed description thereof is omitted here.

Figure 17:
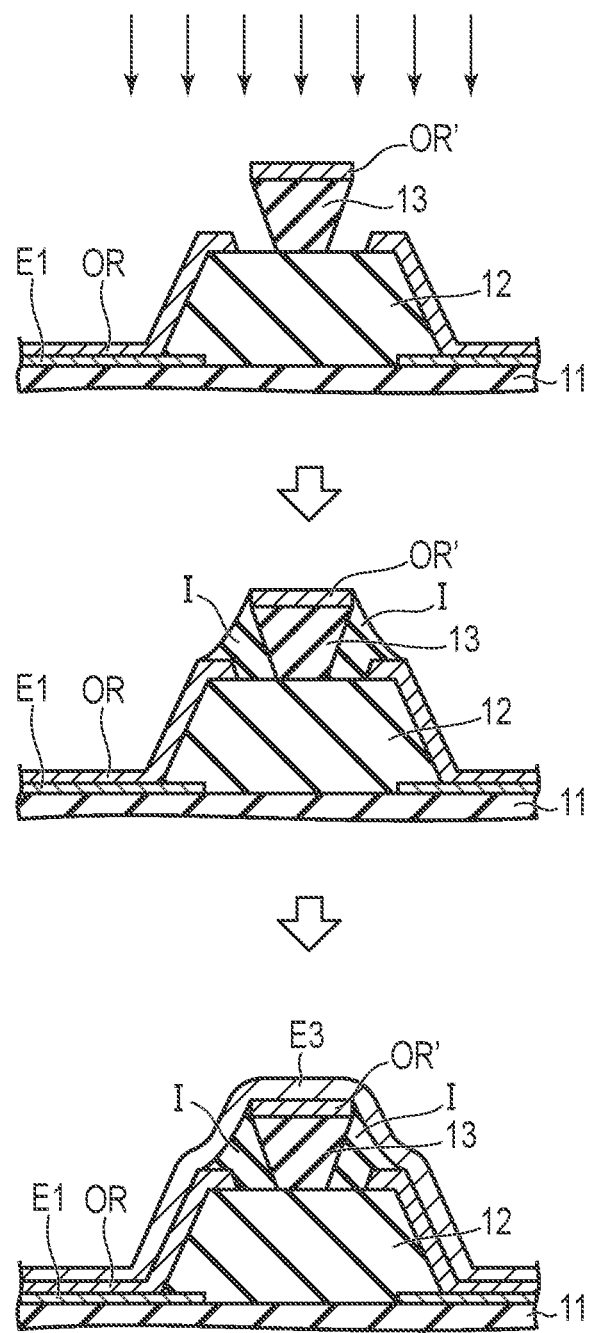
FIG. 17 is a drawing for explaining a process by which an organic layer, an insulator, and a third electrode are formed in the display device according to the present embodiment.

Here, with reference to FIG. 17, a process by which an organic layer OR, an insulator I, and a third electrode E3 are formed in the display device DSP of the present embodiment will be briefly explained. Here, it is assumed that a first electrode E1, an insulating layer 12 including an opening portion OP, and a barrier wall 13 are already formed on an insulating layer 11.

First, the organic layer OR is formed (deposited) by the vacuum deposition method described above. In this case, the organic layer OR that is in contact with the first electrode E1 through the opening portion OP of the insulating layer 12 and is in contact with the insulating layer 12 between the opening portion OP and the barrier wall 13 is formed. In addition, an organic layer OR' is formed on the upper surface of the barrier wall 13.

In the case where the organic layer OR is formed in the manner described above, the insulator I is formed to cover the side surfaces of the barrier wall 13 and the edge portion of the organic layer OR. This insulator I is formed by, for example, applying an insulating material such as resin over a display area DA (a plurality of pixels PX provided in the display area DA) and removing the insulating material so that only the portion in the space formed by the side surfaces of the barrier wall 13, the edge portion of the organic layer OR, and the insulating layer 12 remains. Note that the insulator I may be formed by patterning using, for example, a photomask.

In order to prevent air bubbles from entering the insulator I, the insulator I may be formed by maintaining the vacuum state after the organic layer OR described above is formed by the vacuum deposition method.

In the case where the insulator I is formed in the manner described above, for example, the third electrode E3 is formed (deposited) over a plurality of pixels PX disposed in the display area DA. According to such a third electrode E3, a common voltage can be applied to each of the plurality of pixels PX.

As described above, the display device DSP of the present embodiment includes a base material 10, the insulating layer 11 (first insulating layer) disposed on the base material 10, the first electrode E1 disposed on the insulating layer 11, the insulating layer 12 (second insulating layer) disposed on the insulating layer 11 and including the opening portion OP overlapping with the first electrode E1, and the barrier wall 13 disposed on the insulating layer 12. The display device DSP of the present embodiment also includes the organic layer OR that is in contact with the first electrode through the opening portion OP and is also in contact with the insulating layer 12 between the opening portion OP and the barrier wall, the insulator I that covers the side surfaces of the barrier wall 13 and the edge portion of the organic layer OR, and the third electrode E3 (second electrode) that covers the organic layer OR, the barrier wall 13, and the insulator I.

In the present embodiment, the above-described configuration can suppress the generation of a leak current from the edge portion of the organic layer OR in the same manner as in the first embodiment.

Here, FIG. 18 and FIG. 19 show enlarged views of the edge portion of the organic layer OR in the display device DSP according to the present embodiment.

FIG. 18 shows an organic layer OR in which the functional layer F1 is covered by the light-emitting layer EL, and the light-emitting layer EL is covered by the functional layer F2. In the case where the edge portion of the organic layer OR is covered by the insulator I as shown in FIG. 18, no leak current is generated from the organic layer OR.

Furthermore, FIG. 19 shows an organic layer OR in which the light-emitting layer EL is disposed on the functional layer F1, and the functional layer F2 is disposed on the light-emitting layer EL (that is, an organic layer OR in which the functional layer F1 is not covered by the light-emitting layer EL, and the light-emitting layer EL is not covered by the functional layer F2). However, even in a case where the edge portion of the organic layer OR is covered by the insulator I as shown in FIG. 19, no leak current is generated from the organic layer OR.

That is, in the above-mentioned first embodiment, there is a possibility that a leak current may be generated by forming the organic layer OR and the second electrode E2 in the manner shown in FIG. 11; however, in the present embodiment, it is possible to suppress the generation of a leak current even in the case where the organic layer OR is formed in the manner shown in FIG. 18. It is also possible to suppress the generation of a leak current even in the case where the organic layer OR is formed in the manner shown in FIG. 19.

In the above-mentioned first embodiment, for example, a configuration in which the second electrode E2 is provided to protect the display element 20 (e.g., the organic layer OR) in the process of forming the insulator I is adopted; however, in the case where it is unnecessary to protect the display element 20 in the process of forming the insulator I (i.e., there is no damage to the element), the configuration of the present embodiment can be adopted, and the manufacturing process of the display device DSP can be simplified compared to the first embodiment described above.

Figure 20:
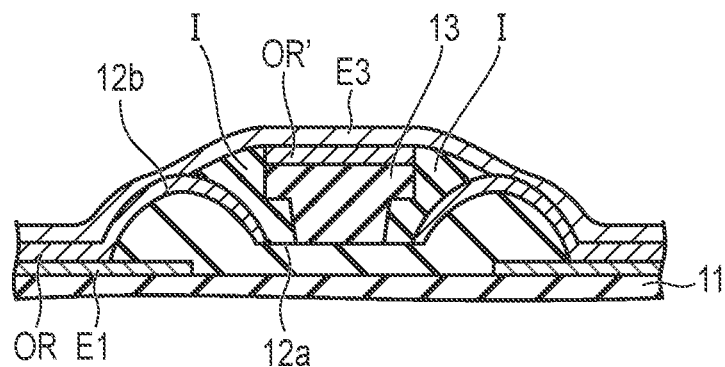
FIG. 20 shows another example of the configuration in the periphery of the insulator.
Figure 21:
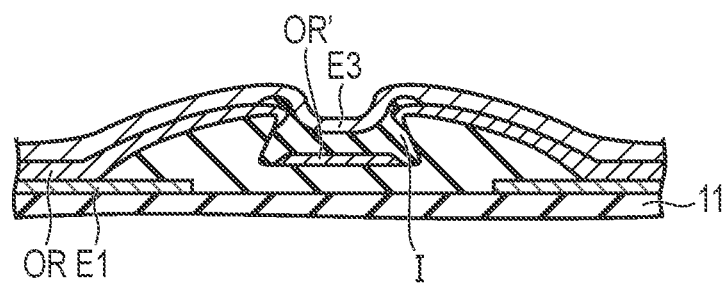
FIG. 21 shows yet another example of the configuration in the periphery of the insulator.

In the present embodiment, an example of the configuration of the display device DSP has been described using FIG. 16; however, the periphery of the insulator I in the display device DSP can also be configured in the manner shown in, for example, FIG. 20 or FIG. 21. Since the configuration shown in FIG. 20 and FIG. 21 is similar to that of FIG. 12 and FIG. 13 described above except that the second electrode E2 is omitted, a detailed explanation thereof is omitted here.

Furthermore, although the detailed explanation is omitted, the display device DSP of the present embodiment may be configured to be provided with a color filter or a light conversion layer, or may be configured so that the pixel PX is provided with a plurality of sub-pixels as in the first embodiment described above.

All display devices, which are implementable with arbitrary changes in design by a person of ordinary skill in the art based on the display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A display device comprising:
a base material;
a first insulating layer disposed on the base material;
a first electrode disposed on the first insulating layer;
a second insulating layer disposed on the first insulating layer and including an opening portion overlapping with the first electrode;
a barrier wall disposed on the second insulating layer;
an organic layer in contact with the first electrode through the opening portion and in contact with the second insulating layer between the opening portion and the barrier wall;
a second electrode disposed on the organic layer;
an insulator covering side surfaces of the barrier wall and edge portions of the organic layer and the second electrode; and
a third electrode covering the second electrode, the barrier wall, and the insulator, wherein
the insulator does not overlap with the opening portion and has a shape of a frame surrounding the organic layer and the second electrode in a plan view,
the second electrode is in contact with the third electrode at a position overlapping with the opening portion, and
the edge portion of the organic layer is not covered with the second electrode and is in contact with the insulator.

2. The display device of claim 1, wherein the barrier wall has a shape in which a width of an upper part is greater than a width of a lower part.

3. The display device of claim 1, wherein
the organic layer includes a light-emitting layer and a functional layer,
the functional layer covers an edge portion of the light-emitting layer, and
the insulator covers an edge portion of the functional layer.

4. The display device of claim 1, wherein
the organic layer includes a light-emitting layer and a functional layer,
the light-emitting layer covers an edge portion of the functional layer, and
the insulator covers an edge portion of the light-emitting layer.

5. The display device of claim 1, wherein
the organic layer includes a light-emitting layer and a functional layer,
the functional layer is disposed on the light-emitting layer, and
the insulator covers edge portions of each of the light-emitting layer and the functional layer.

6. The display device of claim 1, wherein
the organic layer includes a light-emitting layer and a functional layer,
the light-emitting layer is disposed on the functional layer, and
the insulator covers edge portions of each of the light-emitting layer and the functional layer.

7. The display device of claim 1, wherein
the second insulating layer includes a first surface on which the barrier wall is disposed and a second surface on which the barrier wall is not disposed,
the first surface is a lower surface of the second insulating later, and
the second surface is an upper surface of the second insulating layer, which is higher than the first surface.

8. A display device comprising:
a base material;
a first insulating layer disposed on the base material;
a first electrode disposed on the first insulating layer;
a second insulating layer disposed on the first insulating layer and including an opening portion overlapping with the first electrode;
an organic layer in contact with the first electrode through the opening portion and disposed on a position overlapping with a pixel;
a second electrode disposed on the organic layer;
an insulator covering edge portions of the organic layer and the second electrode; and
a third electrode covering the second electrode and the insulator, wherein
the insulator does not overlap with the opening portion and has a shape of a frame surrounding the organic layer and the second electrode in a plan view,
the second electrode is in contact with the third electrode at a position overlapping with the opening portion, and
the edge portion of the organic layer is not covered with the second electrode and is in contact with the insulator.

* * * * *